(12) United States Patent
Sano (10) Patent No.: US 9,869,834 B2
(45) Date of Patent: Jan. 16, 2018

(54) PHOTOELECTRIC CONVERSION CONNECTOR AND METHOD FOR MANUFACTURING SAME

(71) Applicant: HIROSE ELECTRIC CO., LTD., Tokyo (JP)

(72) Inventor: Yoshiaki Sano, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/619,321

(22) Filed: Jun. 9, 2017

(65) Prior Publication Data

US 2017/0276888 A1 Sep. 28, 2017

Related U.S. Application Data

(62) Division of application No. 15/091,742, filed on Apr. 6, 2016.

(30) Foreign Application Priority Data

Apr. 10, 2015 (JP) ................... 2015-080795

(51) Int. Cl.
*G02B 6/42* (2006.01)
*H01L 33/52* (2010.01)

(52) U.S. Cl.
CPC ........... *G02B 6/4255* (2013.01); *G02B 6/423* (2013.01); *G02B 6/4212* (2013.01); *G02B 6/4214* (2013.01); *H01L 33/52* (2013.01); *G02B 6/4261* (2013.01); *G02B 6/4284* (2013.01)

(58) Field of Classification Search
CPC .. G02B 6/4212; G02B 6/4214; G02B 6/4239; G02B 6/4255; H01L 33/52
See application file for complete search history.

(56) References Cited

U.S. PATENT DOCUMENTS

| | | |
|---|---|---|
| 6,328,482 B1 | 12/2001 | Jian |
| 6,714,363 B2 | 3/2004 | Sasaki |
| 6,813,418 B1 | 11/2004 | Kragl |
| 6,832,861 B2 | 12/2004 | Kragl |
| 6,850,674 B2 | 2/2005 | Haraguchi |
| 7,359,646 B2 | 4/2008 | Kropp |
| 8,909,010 B2 | 12/2014 | Kimura |
| 9,383,530 B2 | 7/2016 | Dotorii |
| 2001/0000316 A1 | 4/2001 | Kawai |
| 2008/0210965 A1 | 9/2008 | Hung |

(Continued)

FOREIGN PATENT DOCUMENTS

| | | |
|---|---|---|
| JP | 2010266729 A | 11/2010 |
| JP | 2012177732 | 9/2012 |
| JP | 5331837 | 8/2013 |

*Primary Examiner* — Daniel Petkovsek
(74) *Attorney, Agent, or Firm* — Procopio, Cory, Hargreaves & Savitch LLP (57) ABSTRACT

A photoelectric conversion connector comprising a support, a photoelectric conversion element that is provided on said support and that can be connected to an optical fiber through an optical signal, a first resin member that is formed at the upper part of the photoelectric conversion element, and a second resin member that is formed at the upper part of the first resin member. An optical signal transmitted between the photoelectric conversion element and the optical fiber goes through both the first resin member and the second resin member.

3 Claims, 6 Drawing Sheets

(56) References Cited

U.S. PATENT DOCUMENTS

2009/0274412 A1 11/2009 Sano
2013/0343711 A1 12/2013 Sano
2014/0291716 A1 10/2014 Ukawa
2016/0299302 A1* 10/2016 Sano .................... G02B 6/4255

* cited by examiner

PHOTOELECTRIC CONVERSION CONNECTOR AND METHOD FOR MANUFACTURING SAME

The present application is a divisional of U.S. application Ser. No. 15/091,742, filed Apr. 14, 2016, which claims the benefit of foreign priority under 35 USC § 119 based Japanese Patent Application No. 2015-080795, filed Apr. 10, 2015, the contents of which is incorporated herein in its entirety by reference.

BACKGROUND

1. Technical Field

The present invention relates to a photoelectric conversion connector, and more particularly to a photoelectric conversion connector formed from two (or more) types of resin members, and to a method for manufacturing this connector.

2. Related Art

Patent Document 1 gives an example of a photoelectric conversion connector and its method of manufacture. The photoelectric conversion connector has a conversion function between optical signals and electrical signals, and is combined with an electrical connector (mating connector) to constitute a photoelectric conversion device. Using a photoelectric conversion connector allows an optical signal from an optical fiber connected to the photoelectric conversion connector to be converted into an electrical signal and transmitted to an electrical connector, and conversely allows an electrical signal from the electrical connector to be converted into an optical signal and transmitted to the optical fiber.

The photoelectric conversion connector disclosed in Patent Document 1 includes a light emitting element that converts electrical signals into optical signals or a light receiving element serving as an optical semiconductor element that converts optical signals into electrical signals, a drive device that drives the light receiving element or light emitting element (hereinafter the light receiving element and light emitting element will be collectively referred to as a "light emitting/receiving elements"), a support member that supports the light emitting/receiving elements and the drive device, a plurality of terminals serving as terminal contacts that can come into contact with the terminals of the electrical connector (the mating connector), and wire bonding serving as a conductive material that connects the light emitting/receiving elements to the drive device and connects the drive device to terminals.

With the photoelectric conversion connector disclosed in Patent Document 1, the light emitting/receiving elements and so forth are all molded integrally from just a first resin member, and at least the light emitting/receiving elements are sealed by the first resin member.

Also, with the photoelectric conversion connector disclosed in Patent Document 1, a protrusion that comprises a reflective face for adjusting the behavior of an optical signal, such as the optical axis, is provided to just the first resin member, and optical signals are transmitted between the optical fiber and the light emitting/receiving elements through just the first resin member. The outer face of the first resin member is molded integrally from a second resin member, but the second resin member merely covers the first resin member, and this second resin member is not used for behavior adjustment or to seal.

With the photoelectric conversion connector in Patent Document 1, sealing of the light emitting/receiving elements is thus performed by just the first resin member, behavior adjustment is performed by just the first resin member, and communication by optical signal between the optical fiber and the light emitting/receiving elements is performed through just the first resin member.

PRIOR ART DOCUMENT

Patent Document

Patent Document 1: Japanese Patent No. 5,331,837

SUMMARY OF THE INVENTION

Problems to be Solved by the Invention

Semiconductors used in light emitting/receiving elements are known to be susceptible to chemical changes. Accordingly, in the sealing of the light emitting/receiving elements, it is generally necessary to be very careful in the selection of the sealing material so as not to break down the light emitting/receiving elements chemically, such as minimizing the impurity ion content. Therefore, the material of the first resin member in Patent Document 1, for example, is subject to significant restrictions in relation to sealing.

Also, behavior adjustment demands precise molding and a fine shape, and since a high-precision mold is required to perform transfer molding, this drives up the manufacturing cost, and high-density molding (multiple patterning) is difficult. Also, with injection molding, resin flow and pressure are relatively high during molding, so there is the risk of breaking or deforming the light emitting/receiving elements or the wire bonding, which has relatively low strength and is disposed around these elements. Accordingly, the first resin member is also subject to significant restrictions in relation to molding.

Furthermore, with the photoelectric conversion connector disclosed in Patent Document 1, since optical signals are transmitted between the optical fiber and the light emitting/receiving elements through just the first resin member, behavior adjustment cannot be performed using the second resin member, for example, and significant restrictions are also imposed from the standpoint of optical design.

Thus, with the configuration in Patent Document 1, in which sealing of the light emitting/receiving elements is performed by just the first resin member, behavior adjustment is also performed by just the first resin member, and communication by optical signal between the optical fiber and the light emitting/receiving elements is performed through just the first resin member, various restrictions are imposed, particularly in relation to the first resin member, and as a result there is less latitude in the design of the photoelectric conversion connector.

The present invention was conceived in an effort to solve these problems encountered in the past, and it is an object thereof to afford greater latitude in the design of a photoelectric conversion connector.

SUMMARY

A photoelectric conversion connector according to a mode of the present invention comprises a support; a photoelectric conversion element that is provided on said support and that can be connected to an optical fiber through an optical signal; a first resin member that is formed at the upper part of the photoelectric conversion element; and a second resin member that is formed at the upper part of the first resin member, wherein an optical signal transmitted between the photoelectric conversion element and the optical fiber goes through both the first resin member and the second resin member.

With this embodiment, an optical signal transmitted between the optical fiber and the photoelectric conversion element goes through two (or more) types of resin members, namely, a first resin member and a second resin member, which means that high-precision molding is performed with the second resin member, for example, and the first resin member does not require any precise working or a fine shape, etc., and this affords greater latitude in the design of a photoelectric conversion connector.

With the photoelectric conversion connector in the above mode, the photoelectric conversion element may be sealed by the first resin member.

With this embodiment, because two (or more) types of resin members, namely, a first resin member and a second resin member, are used, the first resin member can be specialized for sealing. In other words, the first resin member can be made of a material that minimizes impurity ion content in the resin material, so that the included semiconductor (such as a photoelectric conversion element) will not be broken down chemically, and transfer molding can be used instead of injection molding.

Also, the photoelectric conversion connector in the above mode further comprises wire bonding provided over the support, wherein said wire bonding may be sealed by the first resin member along with the optical conversion element.

When ordinary injection molding is used, there is the possibility that wiring, such as wire bonding, will end up being deformed by pressure or resin flow during molding, similar to the optical conversion element, but with this embodiment, because two (or more) types of resin, namely, a first resin member and a second resin member, are used, transfer molding rather than injection molding can be used for the first resin member, and the wire bonding can be sealed along with the optical conversion element by the first resin member.

Furthermore, with the photoelectric conversion connector in the above mode, the refractive index of the first resin member may be different from the refractive index of the second resin member.

With this embodiment, because two (or more) types of resin members, namely, a first resin member and a second resin member, are used, different refractive indexes can be set for the first resin member and the second resin member, and greater latitude can be obtained in optical design by combining the refractive indexes of these two or more types.

Furthermore, with the photoelectric conversion connector in the above mode, a means for adjusting the optical axis of the optical signal may be provided to only the second resin member, or to both the first resin member and the second resin member.

With this embodiment, because two (or more) types of resin members, namely, a first resin member and a second resin member, are used, transfer molding can be used for the first resin member, and injection molding for the second resin member. As a result, injection molding, which is suited to high-precision molding and fine shapes, can be used for the second resin member, making it easy to form a behavior adjustment means. Also, since the first resin member and the second resin member are both molded articles, if high-precision molding and a fine shape are not required, it is possible to provide a behavior adjustment means to the first resin member, and greater latitude can be obtained in optical design by combining these two or more types of behavior adjustment means.

Furthermore, with the photoelectric conversion connector in the above mode, the behavior adjustment means of the first resin member may include a light receiving face disposed opposite the distal end of the optical fiber, and said light receiving face may be set to an acute angle or an obtuse angle with respect to the direction in which the light moves from the optical fiber.

Because the light receiving face is set to an acute angle or an obtuse angle with respect to the direction in which the light moves from the optical fiber, reflected return light from the light receiving face to the optical fiber can be reduced.

Furthermore, with the photoelectric conversion connector in the above mode, the behavior adjustment means of the second resin member may include a light receiving face disposed opposite the photoelectric conversion element, and said light receiving face may be set to an acute angle or an obtuse angle with respect to the direction in which the light moves from the photoelectric conversion element.

Because the light receiving face is set to an acute angle or an obtuse angle with respect to the direction in which the light moves from the photoelectric conversion element, reflected return light from the light receiving face to the photoelectric conversion element can be reduced.

Also, with the photoelectric conversion connector in the above mode, the first resin member may be a transparent thermosetting epoxy or a transparent silicone resin, and the second resin member is a polyether imide or a polycarbonate.

With this embodiment, because two (or more) types of resin members, namely a first resin member and a second resin member, are used, the most suitable resin member can be selected for each.

A photoelectric conversion device is provided, which includes the photoelectric conversion connector in the above mode and an electrical connector that is connected to said photoelectric conversion connector.

A method for manufacturing a photoelectric conversion connector according to a mode of the present invention, comprising the steps of: forming the upper part of an optical conversion element provided on a support from a first resin member; and forming the upper part of the first resin member from a second resin member, wherein an optical signal transmitted between the photoelectric conversion element and the optical fiber goes through both the first resin member and the second resin member.

With this configuration, a novel method for manufacturing a photoelectric conversion connector is provided, with which communication by optical signal between a photoelectric conversion element and an optical fiber is performed through two (or more) types of resin members, namely, a first resin member and a second resin member.

With the method for manufacturing a photoelectric conversion connector according to a mode of the present invention, the molding of the first resin member may be performed by transfer molding, and the molding of the second resin member may be performed by injection molding.

With this embodiment, because two (or more) types of resin members, namely, a first resin member and a second resin member, are used, transfer molding can be used for the first resin member, and injection molding for the second resin member.

With the method for manufacturing a photoelectric conversion connector according to a mode of the present invention, the curing time of the first resin member may be longer than the curing time of the second resin member.

With this embodiment, because two (or more) types of resin members, namely, a first resin member and a second resin member, are used, a member with a longer curing time than that of the second resin member can be selected for the first resin member, for example, to strike a good balance in the step duration during manufacture by using higher density (multiple patterning) in molding, particularly for the first resin member.

With the method for manufacturing a photoelectric conversion connector according to a mode of the present invention, the first resin member may be a transparent thermosetting epoxy or a transparent silicone resin, and the second resin member may be a polyether imide or a polycarbonate.

Effects of the Invention

The present invention affords greater latitude in the design of a photoelectric conversion connector.

DETAILED DESCRIPTION

The photoelectric conversion connector pertaining to a preferred embodiment of the present invention, as well as a method for manufacturing this, will now be described through reference to the appended Drawings.

Figure 1A:
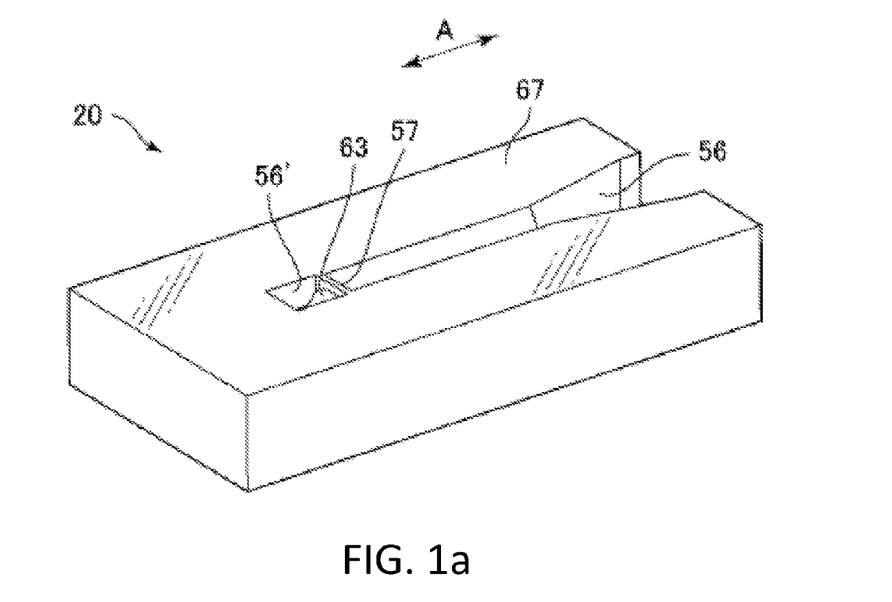
FIGS. 1a and 1b A top oblique view and a bottom oblique view of the photoelectric conversion connector pertaining to an embodiment of the present invention.
Figure 1B:
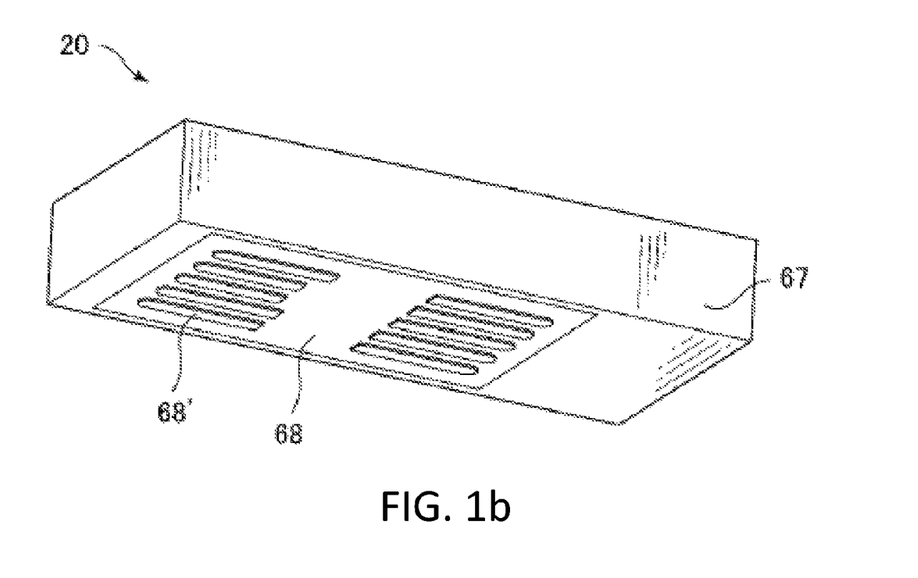
Figure 2:
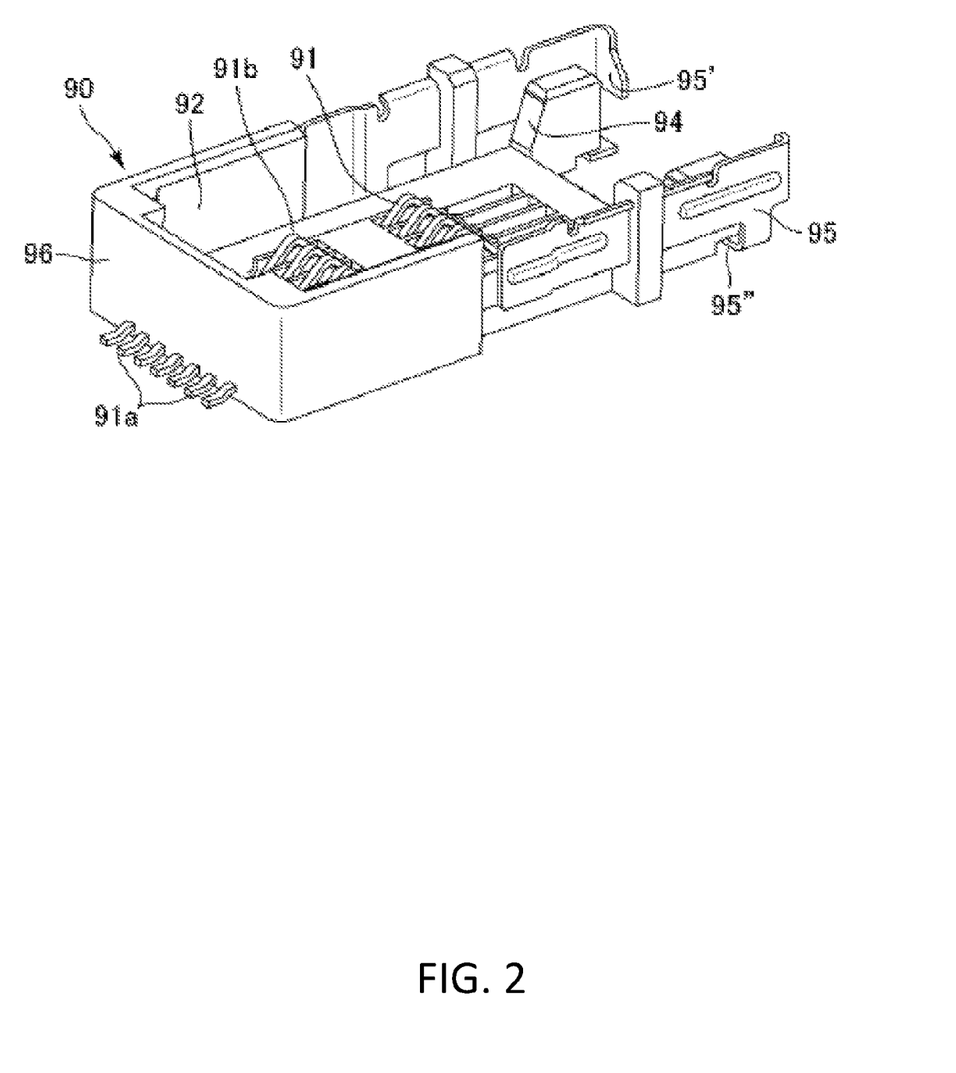
FIG. 2 An oblique view of an electrical connector that can be mated with the photoelectric conversion connector in FIGS. 1a and 1b.

FIGS. 1a and 1b are respectively a top oblique view and a bottom oblique view of a photoelectric conversion connector 20 pertaining to an embodiment of the present invention. FIG. 2 is an oblique view of an electrical connector 90 that can be mated with this photoelectric conversion connector 20. The photoelectric conversion connector 20 can be mated with the electrical connector 90 to constitute a photoelectric conversion device.

The electrical connector 90 includes a housing 96 formed from resin or another such insulating material, and terminals 91 provided on the bottom of this housing 96. A mating cavity 92 for mating with the photoelectric conversion connector 20 is formed in the middle of the housing 96. One end of the terminals 91 is formed as connection components 91a that are fixed to a substrate (not shown), and the other end is formed as contact components 91b that project upward in a peaked shape.

During mating of the electrical connector 90 with the photoelectric conversion connector 20, communication through electrical signals is performed through contact between the contact components 91b of the terminals 91 of the electrical connector 90 and terminal contacts 68' exposed on the bottom of the photoelectric conversion connector 20, between the substrate and the photoelectric conversion device, or more precisely, the optical fiber 10 (FIG. 5, discussed below) connected thereto.

Figure 3:
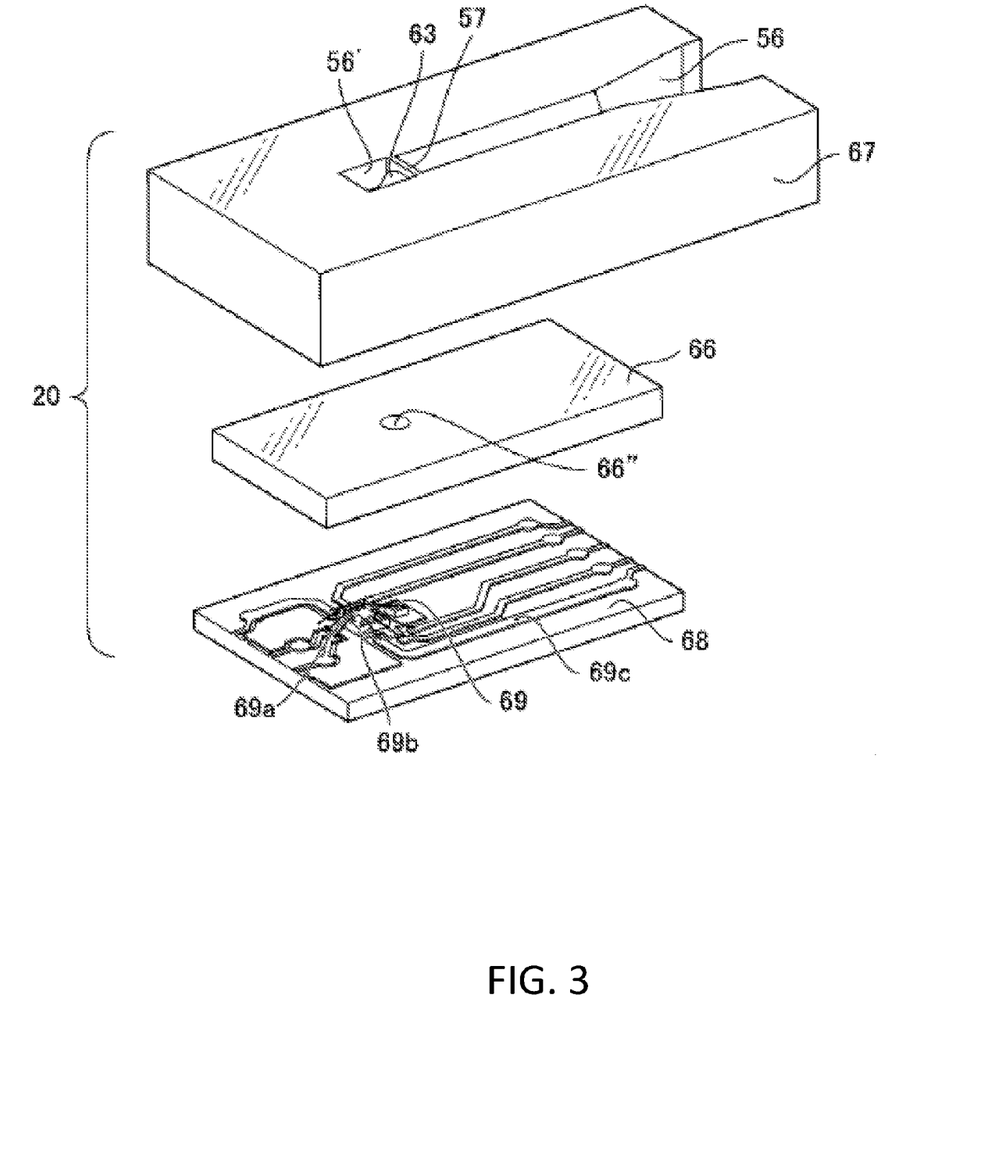
FIG. 3 An exploded oblique view of the photoelectric conversion connector in FIGS. 1a and 1b.
Figure 4:
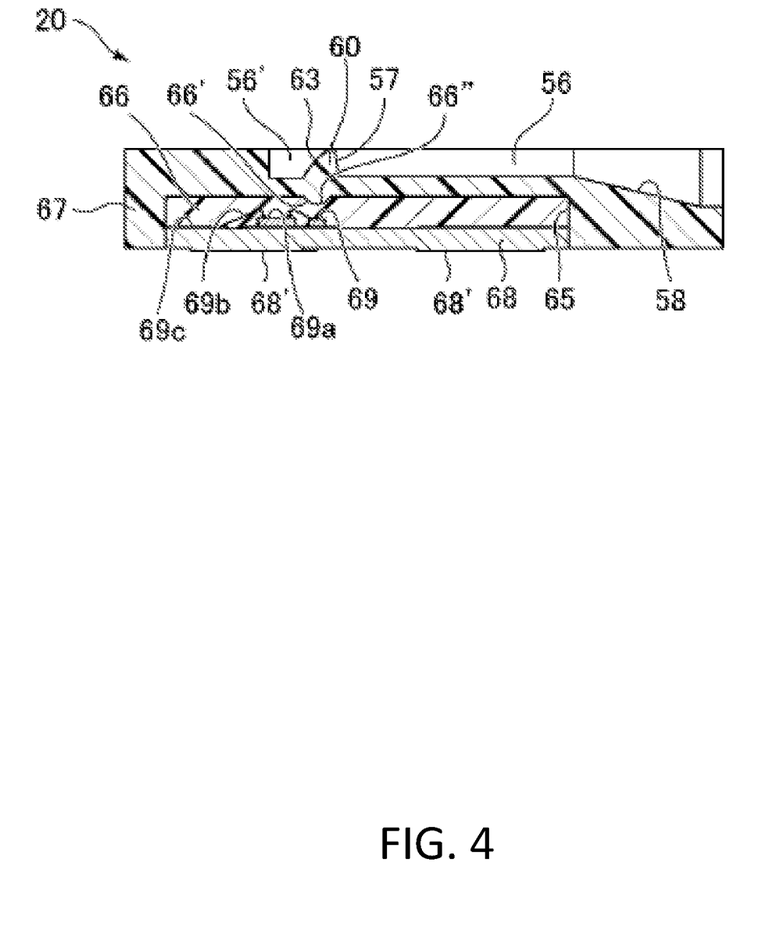
FIG. 4 A center line cross section of the photoelectric conversion connector in FIGS. 1a and 1b.

FIG. 3 is an exploded oblique view of the photoelectric conversion connector 20, and FIG. 4 is a center line cross section of the photoelectric conversion connector 20. The photoelectric conversion connector 20 has a resin member 67 (second resin member) serving as the main body, a support 68 disposed on the bottom side 65 of the resin member 67, and a resin member 66 (first resin member) that covers the support 68. The support 68 may be not only an ordinary substrate, but also a lead frame. Connector contact pads are preferably provided to the substrate. In the case of a lead frame, the frame is formed so as to be a connector contact in a later step.

A positioning groove 56 is provided passing through the resin member 67 in the up and down direction along the axial direction of the optical fiber (the arrow A direction in the Drawings). The core wire of the optical fiber may be inserted into the positioning groove 56 along the axial direction A. To make insertion easier, the insertion side of the core wire may be formed wider. For the same reason, a guide taper 58 that gently slopes toward the very back of the positioning groove 56 may be provided. A reflector 60 that is substantially triangular in side view and is formed by providing a groove 56' to the resin member 67 is provided at the very back of the positioning groove 56. An optical axis adjustment mirror 63 serving as a means for adjusting the behavior of an optical signal, such as its optical axis, is formed on the back face of the reflector 60. Because the optical axis adjustment mirror 63 is formed in as a spherical face, it has a light converging function in addition to its reflecting function.

Conversion between an optical signal and an electrical signal can be performed by a photoelectric conversion element 69 provided on the support 68. The photoelectric conversion element 69 referred to here encompasses both a light receiving element (such as a photodiode (PD)) serving as an optical semiconductor element for converting optical signals into electrical signals, and a surface emitting type of light emitting element (such as a vertical cavity surface emitting laser (VCSEL)) serving as an optical semiconductor element. Either of these may be selected, as dictated by the situation. More specifically, these include an LED, a semiconductor laser, a photodiode, and so forth.

In addition to the photoelectric conversion element 69, also mounted on the support 68 are a drive device 69a for driving the photoelectric conversion element 69, wiring 69b such as wire bonding or lead wires, and other wiring 69c. If the photoelectric conversion element 69 is a light receiving element, then the drive device 69a referred to here includes a transimpedance amplifier/limiting amplifier (TIA/LA), for example, and if the photoelectric conversion element 69 is a light emitting element, then the drive device 69a includes a VCSEL driver, for example. In any case, the drive device 69a can be electrically connected to the terminal contacts 68'. The plurality of terminals serving as the terminal contacts 68' that come into contact with the electrical connector may be embedded in the support 68. These terminals may be part of the drive device 69a. The wire bonding 69b is, for example, a conductive material that connects the photoelectric conversion element 69 to the drive device 69a, and connects the drive device 69a to the other wiring 69c.

The various elements on the support 68 are protected by the resin member 66 (first resin member). The photoelectric conversion element 69, the drive device 69a, and the wire bonding 69b (excluding the wiring 69c) are preferably completely sealed by the resin member 66. The terminal contacts 68' provided to the support 68 are provided in an exposed state on the bottom face of the support 68. These terminal contacts 68' are electrically connected to the wiring 69c that is disposed on the front side of the support 68, through vias that are provided to the support 68, for example.

A recess 66" that protrudes inward is provided to the upper face of the resin member 66, thereby forming a convex lens 66' that can adjust the behavior of an optical signal, such as its optical axis. Since the surface of the convex lens 66' is spherical, the convex lens 66' has the same function as the optical axis adjustment mirror 63, for example, which is a behavior adjustment means for the resin member 67. The convex lens 66' and the optical axis adjustment mirror 63 function together as a means for adjusting the behavior of an optical signal, such as its optical axis. In this embodiment, the recess 66" is used, but depending on the usage mode, a convex component that protrudes outward may be used instead of a recess. Similarly, the surface of the convex lens 66' does not necessarily have to be spherical, and depending on the usage mode, may be aspherical.

An example of an optical axis adjustment method using the convex lens 66' and the optical axis adjustment mirror 63 will now be described through reference to FIG. 5.

Figure 5:
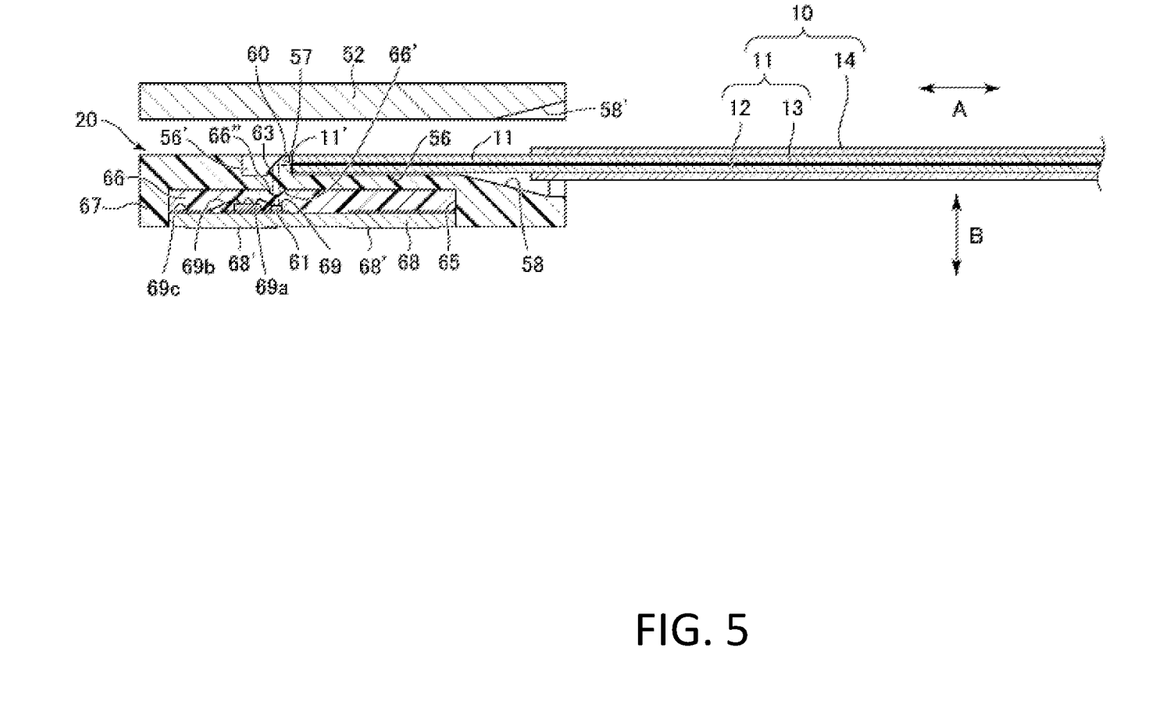
FIG. 5 A diagram illustrating an optical axis adjustment method.

In the example in FIG. 5, unlike what is shown in FIG. 1, etc., a cover 52 that covers the photoelectric conversion connector 20 is shown, but the cover 52 is not necessarily required. When the cover 52 is provided, the core wire 11 insertion side is preferably widened, and a taper 58' is provided to the corresponding part of the taper 58, just as with the positioning groove 56 in order to make it easier to insert the core wire 11.

The optical fiber 10 provided to the photoelectric conversion connector 20 may be considered to be the same as what is generally used. Specifically, it has the core wire 11 composed of a core 12 at the center and cladding 13, and also has a cover 14 that covers the outer periphery of the core wire 11. The optical fiber 10 is preferably a multimode fiber, and the material may be plastic or quartz. A signal is transmitted from the optical fiber 10 to the terminals of the electrical connector by the following procedure. An optical signal emitted from the distal end 11' of the core wire 11 first spreads out somewhat in the forward direction as indicated by the optical axis 61, while going through a boundary face 57 (light receiving face) disposed opposite the distal end 11' of the core wire 11 and being taken into the reflector 60. The optical signal taken into the reflector 60 has its direction converted to substantially a right angle by the optical axis adjustment mirror 63 formed in the resin member 67, and is converged toward the convex lens 66'. The optical signal converged by the convex lens 66' is then incident on the photoelectric conversion element 69. The incident optical signal is converted into an electrical signal by the photoelectric conversion element 69, after which it is taken out to the outside through contact with the terminal contacts 68' exposed on the bottom of the support 68 of the photoelectric conversion connector 20 and the terminals of the electrical connector. The boundary face 57 of the reflector 60 is set to an acute angle or an obtuse angle with respect to the direction in which the light moves from the optical fiber 10 (the arrow A in the Drawings), so the reflected return light from the boundary face 57 to the optical fiber 10 can be reduced.

Conversely, the transmission of signals from the terminals of the electrical connector to the optical fiber 10 installed in the photoelectric conversion connector 20 is carried out by the reverse procedure from that given above.

An electrical signal taken in through contact between the terminals of the electrical connector and the terminal contacts 68' exposed on the bottom of the support 68 of the photoelectric conversion connector 20 is first converted into an optical signal through the photoelectric conversion element 69 (shown as the optical axis 61), after which it spreads out somewhat in the forward direction while being guided to the convex lens 66' disposed opposite the photoelectric conversion element 69. After this, the optical signal goes through the boundary face (light emitting face) of the convex lens 66' and is converged toward the optical axis adjustment mirror 63. After this, the direction of the optical signal is converted to substantially a right angle by the optical axis adjustment mirror 63 formed in the resin member 67, the optical signal is converged toward the boundary face 57, and after passing through the boundary face 57, is transmitted from the distal end 11' of the core wire 11 disposed opposite the boundary face 57 to the optical fiber 10. Although it follows a curve, the boundary face of the convex lens 66' is similar to the boundary face 57 of the reflector 60 in that it is set to an overall obtuse angle or acute angle with respect to the direction in which the light moves from the photoelectric conversion element 69 (the arrow B in the Drawings), and therefore reflected return light from the boundary face to the photoelectric conversion element 69 can be reduced.

Thus, with this embodiment, a plurality of optical axis adjustment means are provided, namely, the optical axis adjustment mirror 63 of the resin member 67 and the convex lens 66' of the resin member 66, so these means can be given the optical functions of convergence, refraction, and reflection, which affords greater latitude in optical design.

Also, because an optical signal transmitted between the photoelectric conversion element 69 and the optical fiber 10 passes through two (or more) types of resin members (the resin member 66 and the resin member 67), high-precision molding can be performed for the resin member 67, while high-precision working and fine shapes are unnecessary with the resin member 66, for example, and this affords greater latitude in the design of the photoelectric conversion connector.

The photoelectric conversion connector described above can be manufactured by the following method.

First, the support 68 is readied. In addition to the photoelectric conversion element 69, the drive device 69a, the wire bonding 69b, and the other wiring 69c are also included on the support 68.

Next, the upper parts of these elements are molded, and preferably integrally molded, from the resin member 66 (first resin member).

Finally, the upper part of the resin member 66 is molded, and preferably integrally molded, from the resin member 67 (second resin member).

The molding with the resin member 66 may be performed directly on the support 68, or it may be performed indirectly with an air layer interposed, for example. Also, the molding with the resin member 67 may be performed directly on the resin member 66, or it may be performed indirectly with another layer (not shown) interposed, for example.

However, the photoelectric conversion element 69 and the wire bonding 69b (plus the drive device 69a located around the wire bonding 69b) are preferably completely sealed by direct molding. In other words, the resin member 66 (first resin member) is preferably specialized for sealing. Specialization for sealing allows a material in which the impurity ion content has been minimized to be used as a resin material that will not chemically break down the semiconductor included in the photoelectric conversion element 69, for the resin member 66.

Also, when general injection molding is used for sealing, there is the risk that the wire bonding or other wiring 69b, for example, will be deformed by pressure or resin flow during molding, but this problem can be solved by using transfer molding for the resin member 66.

Thus using two (or more) types of resin members (the resin member 66 and the resin member 67) affords dramatically greater latitude in the design of the photoelectric conversion connector.

For instance, when transfer molding is used for the resin member 66 and injection molding for the resin member 67, a behavior adjustment means can be formed for the resin member 67 by injection molding, which is suited to high-precision molding or fine shapes. A transparent thermosetting epoxy resin or transparent silicone resin can be used in the transfer molding of the resin member 66 here, while a polyether imide or polycarbonate, which are transparent thermoplastic resins, can be used in the injection molding of the resin member 67. The term "transparent" here need only mean that the material is transparent in regard to the wavelength of the transmitted optical signal, and may appear colored to human vision. Therefore, while the resin member 66 and the resin member 67 need to be transparent, they can also be colored.

Also, by using two (or more) types of resin members (the resin member 66 and the resin member 67), a member with a longer curing time than that of the resin member 67 can be selected for the resin member 66, to strike a good balance in the step duration during manufacture by using higher density (multiple patterning) in molding, for the resin member 67.

Furthermore, greater latitude in optical design can be obtained by setting the resin member 66 and the resin member 67 to have mutually different refractive indexes, and combining the refractive indexes of these two or more types.

Since the resin member 66 and the resin member 67 are both molded articles having a specific hardness, as opposed to being a gel or some other amorphous material, a behavior adjustment means can be provided to both of them. As a result, greater latitude in optical design can be obtained by combining the behavior adjustment means of these two or more types. However, a behavior adjustment means does not necessarily have to be provided to the resin member 66, so long as high-precision molding or a fine shape can be applied to the resin member 67.

Figure 6:
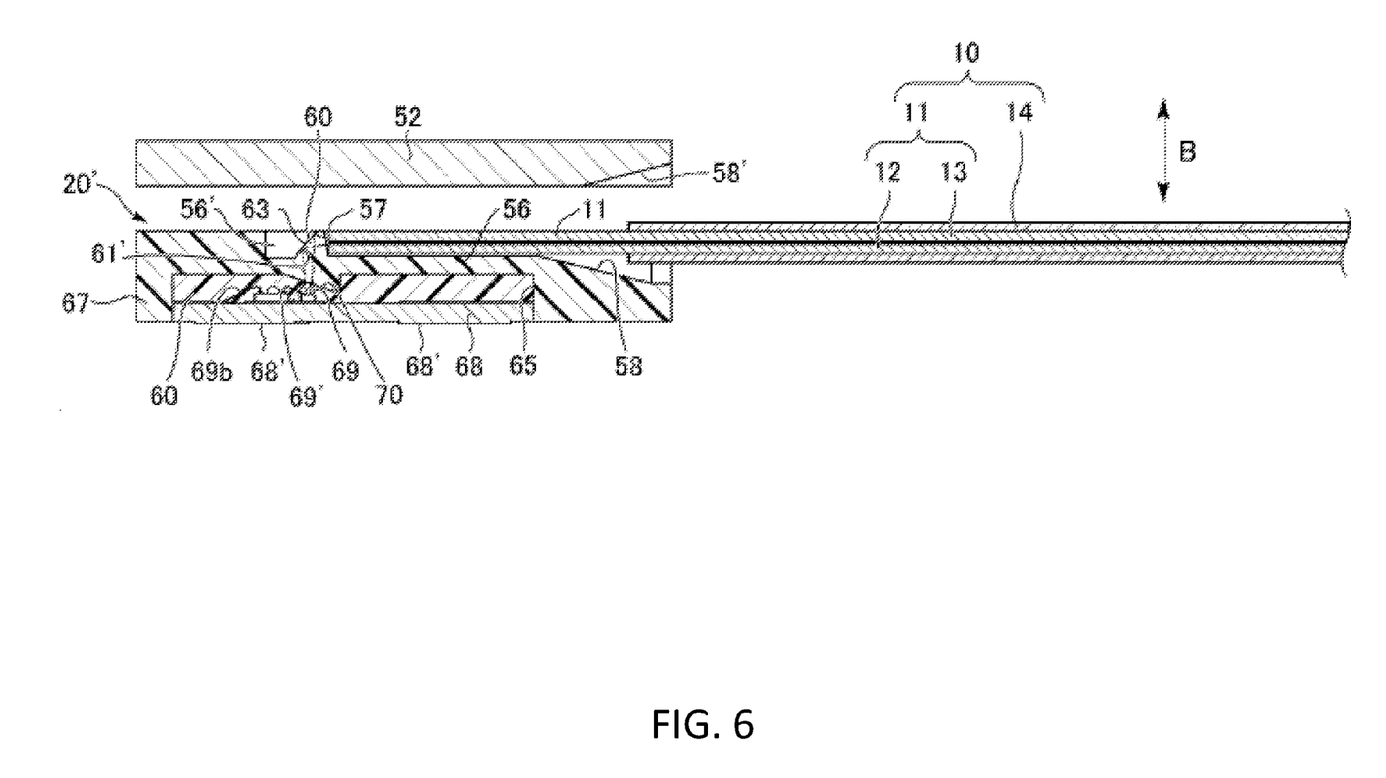
FIG. 6 A diagram of a modification example of a behavior adjustment means.

FIG. 6 shows a modification example of a behavior adjustment means. Here, a flat sloped face 70 is formed in place of the convex lens 66' on the upper face of the resin member 66. In this case, the sloped face 70 (shown as the optical axis 61') does not have a convergence function as does the convex lens 66', but is similar to the convex lens 66' in that it is set to an obtuse angle or an acute angle with respect to the direction in which light from the photoelectric conversion element 69 moves (the arrow B in the Drawings), and this reduces reflected return light from the light receiving face to the photoelectric conversion element 69.

The present invention is not limited to or by the above embodiment, and various other modifications are possible. For instance, in the preferred embodiment given above, the material and so forth of the resin member 66 were described as being different from the material and so forth of the resin member 67, but their material and so forth may be the same, so long as a difference in the refractive index or a difference in the components will be produced by manufacturing the resin members 66 and 67 in separate molding steps.

Therefore, the embodiment disclosed herein is just an example and not limiting in nature, the scope of the present invention should be determined by the claims and not by the description give above, and all modifications within the meaning and range of equivalency of the claims are included.

FIELD OF INDUSTRIAL UTILIZATION

The present invention can be broadly used in photoelectric conversion connectors.

BRIEF DESCRIPTION OF THE DRAWINGS 10 optical fiber
20 photoelectric conversion connector
56 positioning groove
57 boundary face
60 reflector
61 optical axis
63 optical axis adjustment mirror (reflective face)
66 resin member (first resin member)
66' convex lens
67 main body part (second resin member)
68 support
69 photoelectric conversion element
69b wire bonding

The invention claimed is:

1. A method for manufacturing a photoelectric conversion connector, comprising:
   providing an optical conversion element on a support;
   transfer molding a first resin member at an upper part of the optical conversion element;
   injection molding a second resin member at the upper part of the first resin member, the second resin member comprising a positioning component, and a reflector disposed in an inner portion of the positioning component; and
   providing wire bonding over the support, wherein the wire bonding is sealed by the first resin member along with the optical conversion element;
   wherein an optical signal transmitted between the optical conversion element and the optical fiber goes through both the first resin member and the second resin member;
   wherein the first resin member is composed of a first type of resin, and the second resin member is composed of a second type of resin that is different from the first type of resin.

2. The method for manufacturing a photoelectric conversion connector according to claim 1, wherein the curing time of the first resin member is longer than the curing time of the second resin member.

3. The method for manufacturing a photoelectric conversion connector according to claim 1, wherein the first resin member is a transparent thermosetting epoxy or a transparent silicone resin, and the second resin member is a polyether imide or a polycarbonate.

* * * * *